(12) United States Patent
Reeswinkel et al.

(10) Patent No.: US 11,398,588 B2
(45) Date of Patent: Jul. 26, 2022

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Thomas Reeswinkel, Regensburg (DE); Kathy Schmidtke, Mainburg (DE)

(73) Assignee: OSRAM OLED GMBH, Regensburg (DE)

( * ) Notice: Subject to any disclaimer, the term of this patent is extended or adjusted under 35 U.S.C. 154(b) by 17 days.

(21) Appl. No.: 16/964,937

(22) PCT Filed: Jan. 18, 2019

(86) PCT No.: PCT/EP2019/051266
§ 371 (c)(1),
(2) Date: Jul. 24, 2020

(87) PCT Pub. No.: WO2019/145229
PCT Pub. Date: Aug. 1, 2019

(65) Prior Publication Data
US 2021/0043813 A1    Feb. 11, 2021

(30) Foreign Application Priority Data
Jan. 25, 2018   (DE) .................. 102018101710.3

(51) Int. Cl.
| H01L 33/56 | (2010.01) |
| H01L 33/62 | (2010.01) |
| C08G 77/12 | (2006.01) |
| C08L 83/04 | (2006.01) |

(52) U.S. Cl.
CPC .............. *H01L 33/56* (2013.01); *C08G 77/12* (2013.01); *C08L 83/04* (2013.01); *H01L 33/62* (2013.01)

(58) Field of Classification Search
CPC ....... H01L 33/56; C08G 77/045; C08K 5/549; C08K 5/5435; C07F 7/21
See application file for complete search history.

(56) References Cited

U.S. PATENT DOCUMENTS

| 2012/0199872 A1 | 8/2012 | Chen et al. |
| 2015/0028373 A1 | 1/2015 | Abe et al. |

FOREIGN PATENT DOCUMENTS

| CN | 206820020 | * 12/2017 |
| CN | 206820020 U | 12/2017 |
| JP | 2013179124 A | 9/2013 |

OTHER PUBLICATIONS

Wikipedia—CVD (https://en.wikipedia.org/wiki/Chemical_vapor_deposition)(date unknown).*

* cited by examiner

*Primary Examiner* — Kuo Liang Peng
(74) *Attorney, Agent, or Firm* — Slater Matsil, LLP

(57) ABSTRACT

An optoelectronic component and a method for producing an optoelectronic component are disclosed. In an embodiment an optoelectronic component includes at least one optoelectronic semiconductor chip configured to emit radiation and an encapsulation around the semiconductor chip. The encapsulation is a polysiloxane. A barrier layer can be used for protection against harmful gases, the barrier layer being arranged on the encapsulation. The barrier layer is a plasma-polymerized siloxane layer.

18 Claims, 11 Drawing Sheets

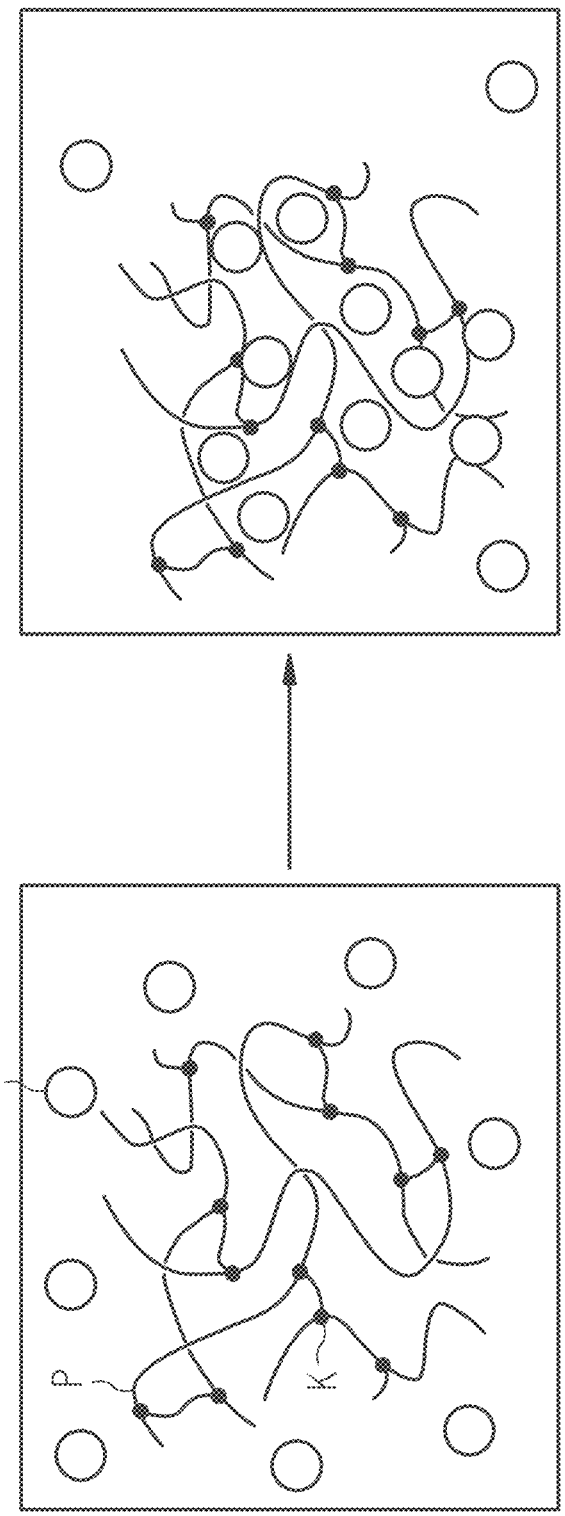

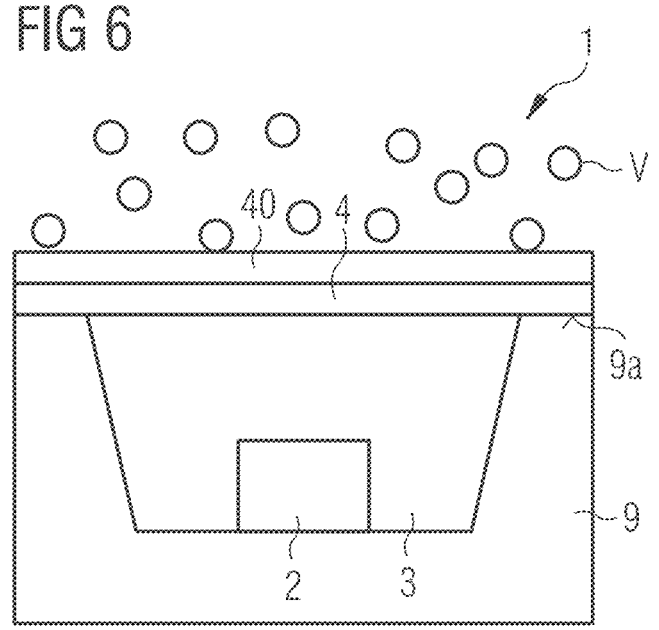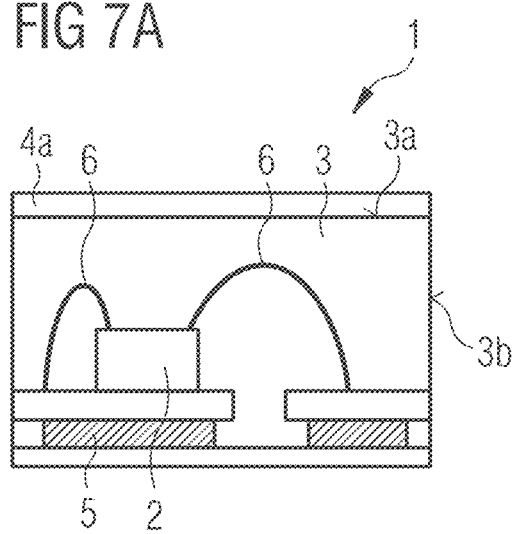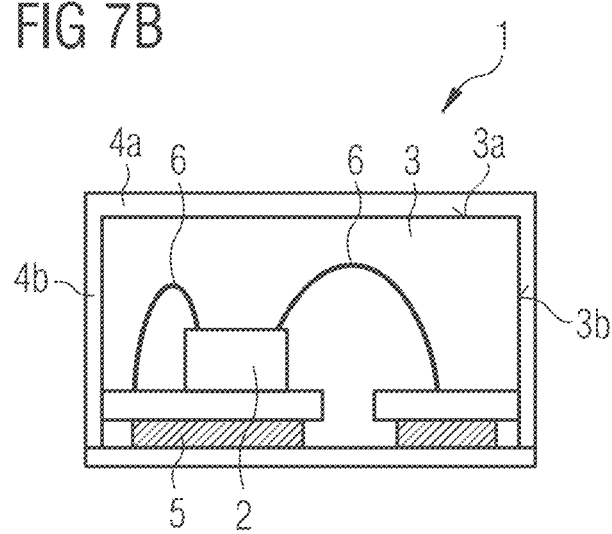

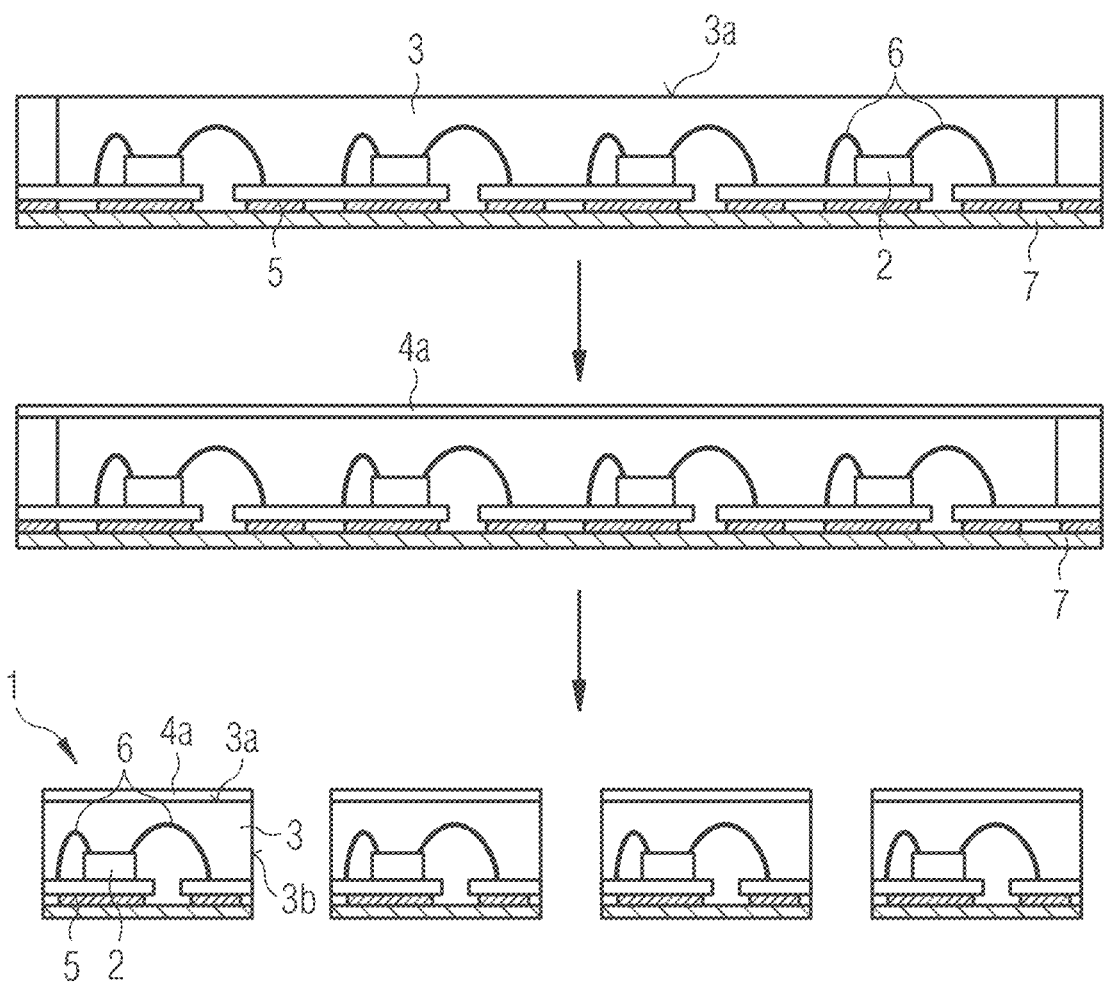

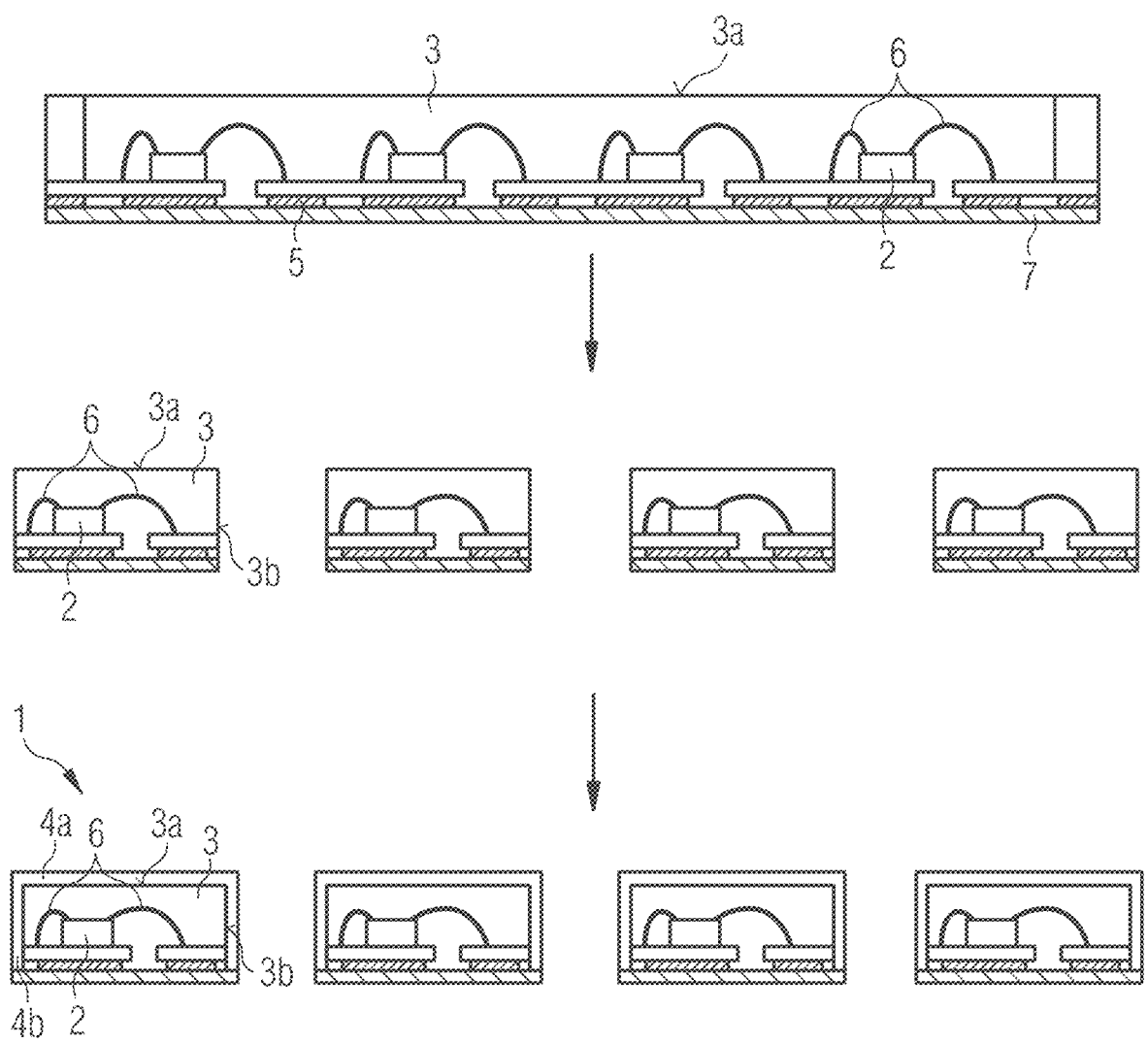

OPTOELECTRONIC COMPONENT AND METHOD FOR PRODUCING AN OPTOELECTRONIC COMPONENT

This patent application is a national phase filing under section 371 of PCT/EP2019/051266, filed Jan. 18, 2019, which claims the priority of German patent application 102018101710.3, filed Jan. 25, 2018, each of which is incorporated herein by reference in its entirety.

TECHNICAL FIELD

The invention relates to an optoelectronic component. The invention further relates to a method for producing an optoelectronic component.

BACKGROUND

Optoelectronic components often have encapsulations which have a certain gas permeability. For this reason, harmful gases, such as volatile organic compounds (VOCs), can permeate the encapsulation and reach the surface of the semiconductor chip of the optoelectronic component. The radiation emitted by such a semiconductor chip in combination with the locally increased temperatures in the vicinity of the semiconductor chip finally lead to the decomposition and deposition of the harmful gases inside the optoelectronic component. This results in a loss of brightness, for example due to carbon depositions resulting from the deposition of VOCs in the beam path of the component. Such an optoelectronic component then emits light with reduced brightness and in a different light color. The optoelectronic component is thus not stable in the presence of the harmful gases.

SUMMARY

Embodiments provide an optoelectronic component that is stable against harmful gases such as VOCs. Further embodiments provide a process for producing an optoelectronic component which produces a component stable against harmful gases.

In at least one embodiment, the optoelectronic component comprises at least one optoelectronic semiconductor chip, which is designed to emit radiation. For example, the optoelectronic component can have exactly one semiconductor chip. For example, the semiconductor chip can emit electromagnetic radiation in the UV wavelength range or in the blue spectrum of visible light.

In at least one embodiment, the optoelectronic component comprises an encapsulation. The encapsulation is arranged around the semiconductor chip, i.e., at least partially encloses it. For example, the semiconductor chip can be arranged on a substrate and the encapsulation encloses the semiconductor chip on the substrate. For example, the encapsulation and the substrate can together completely surround the semiconductor chip. Similarly, the semiconductor chip may be arranged in an indentation of a package so that the package together with the encapsulation completely encloses the semiconductor chip. Completely surrounding in each case means that no opening remains. The encapsulation can be in direct contact with the semiconductor chip or can be spaced apart from the semiconductor chip. The encapsulation is not restricted in terms of its geometry and can be flat or lenticular, for example. It can also have a cavity or be designed as a convex lens. The encapsulation can be, for example, a casting. For example, it can also be a multi-stage encapsulation.

In at least one embodiment, the encapsulation comprises a polysiloxane. Polysiloxanes are in particular polyorganosiloxanes, i.e., silicones. For example, the silicone is a two-component silicone ("2K silicone"), such as thermally curable, addition-crosslinking two-component silicones based on dimethylsiloxane. For example, the encapsulation comprises one or more other materials in addition to the polysiloxane. The encapsulation can therefore comprise several materials or consist of several materials. For example, the encapsulation may comprise one or more phosphors and/or converting materials, which may be distributed in the form of particles in the encapsulation. A converter material converts a primary radiation with a shorter wavelength into a secondary radiation with a longer wavelength. For example, the converter material may be a material that is excited by blue light and emits yellow light. If the blue light is only partially converted into yellow light, an additive mixture of different spectral colors can be achieved. This principle can also be used to generate white light. However, the encapsulation can also be free of phosphors and converter materials. For example, the encapsulation consists of the polysiloxane.

In at least one embodiment, the optoelectronic component comprises at least one barrier layer for protection against harmful gases. For example, the component comprises exactly one or exactly two barrier layers. A barrier layer is a layer which slows down or completely prevents the permeation of harmful gases into the inside of the component, in particular in the vicinity of the semiconductor chip. For example, a barrier layer is a layer that forms a diffusion barrier for harmful gases.

Here and in the following, harmful gases refer to gaseous substances that can be decomposed and deposited under the influence of radiation from the semiconductor chip of the optoelectronic component and/or under the influence of heat. A deposition inside the optoelectronic component, in particular in the beam path of the component, leads to loss of brightness and color changes. In particular, the harmful gases are so-called VOCs, i.e., volatile organic compounds. This is a collective term for organic, i.e., carbon-containing substances that evaporate easily or are already present as a gas at low temperatures, e.g. room temperature. The word volatile means that the substances belonging to the group of VOCs evaporate quickly due to their high vapor pressure or low boiling point. For example, VOCs are organic compounds that have a vapor pressure of 0.01 kilopascals or more at 293.15 Kelvin or have a corresponding volatility under the conditions of use. Because VOCs contain carbon, they can cause carbon deposition in the optical path of the optoelectronic component.

In at least one embodiment, the at least one barrier layer is arranged on the encapsulation. In particular, it can be arranged directly on the encapsulation. In this case, directly arranged on the encapsulation means that the encapsulation and the barrier layer comprise a common interface.

In at least one embodiment, the at least one barrier layer is characterized by a lower permeability for harmful gases than the polysiloxane contained in the encapsulation.

In at least one embodiment, the barrier layer is a plasma-polymerized layer, i.e., a layer deposited by means of plasma polymerization. Plasma polymerization is a special plasma-activated variant of chemical vapor deposition (PECVD). In plasma polymerization, precursor compounds, so-called precursors, are activated in the gas phase by a plasma. This activation results in the formation of ionic molecules and first molecular fragments in the form of clusters or chains are already formed in the gas phase. The subsequent condensation of these fragments on the corresponding surfaces, e.g. surfaces of the encapsulation, then causes polymerization under the influence of temperature, electron and ion bombardment and thus the formation of a plasma-polymerized layer.

At least one embodiment relates to an optoelectronic component comprising at least one optoelectronic semiconductor chip configured to emit radiation an encapsulation around the semiconductor chip, wherein the encapsulation comprises a polysiloxane, and at least one barrier layer for protection against harmful gases arranged on the encapsulation, wherein the barrier layer is a plasm-polymerized layer.

This embodiment is explained in more detail below:

Polysiloxanes are characterized by a particularly good long-term stability against light and heat and are in this respect superior to other encapsulation materials such as epoxy resins. The use of polysiloxanes, in particular silicones, as encapsulation material thus makes it possible to obtain optoelectronic components which have a high degree of brightness and color stability under normal aging conditions, i.e., in the absence of harmful gases such as VOCs. In contrast, epoxides today no longer exhibit sufficient light aging stability for most applications.

While polysiloxanes hardly age at all under the influence of light and heat, they however show a comparatively high gas permeability. For this reason, they usually do not offer sufficient protection against harmful gases, especially VOCs. For example, most silicones have gas permeabilities of 10 to 120 $g/m^2/d$ [$g/m^2/d$=gram/square meter*day]. The gas permeability of silicones based on dimethylsiloxane is also in this range. The gas permeability can be determined according to DIN EN ISO 12572 (status: May 2017). For this purpose, the water vapor permeability of 1 mm thick samples is examined and the water vapor diffusion current density is determined. Although the absolute gas permeability for a material depends on the respective gas used, differences in gas permeability between different materials can be easily compared with each other using the gas permeability values for water vapor, since the same trends can be observed for VOCs and water vapor. The gas permeability values given in the further course of the application are also determined and given according to the measuring method mentioned here.

Although there are also encapsulating silicones that have a slightly lower gas permeability, most of these materials show other weaknesses, such as increased light aging, which limits their use for optoelectronic components such as LEDs. A reduction in gas permeability by using highly refractive silicones, which have a phenyl ring as a structural element, was also considered. The best materials of this type have a gas permeability of 8 $g/m^2/d$. However, even these materials cannot achieve comparably low gas permeabilities as epoxy resins, with about 3 $g/m^2/d$ and below.

For this reason, optoelectronic components comprising a polysiloxane as an encapsulation are more stable in the absence of harmful gases than optoelectronic components with other encapsulation materials. However, in the presence of certain harmful gases, such as VOCs, they rapidly lose brightness and change their color properties. Optoelectronic components that have a polysiloxane as an encapsulation are therefore not sufficiently stable against harmful gases.

The inventors have observed that optoelectronic components often come into contact with harmful gases and that these harmful gases lead to a deterioration of the radiation characteristics of the components. Optoelectronic components are regularly further processed after their manufacture. For example, they are installed in other components, machines or vehicles. Occasionally, they are also fitted with secondary optics. Here, the optoelectronic components can come into contact with substances that themselves release harmful gases, such as VOCs. For example, a number of adhesives, such as polyurethane-based adhesives, release VOCs. Components that are installed together with such substances can absorb VOCs during operation. The VOCs permeate encapsulations containing polysiloxanes and are deposited inside the optoelectronic component, e.g. as carbon depositions, which leads to the above-mentioned loss of brightness and color changes.

Optoelectronic components of the embodiment described here therefore have a barrier layer for protection against harmful gases, which is arranged on the encapsulation comprising the polysiloxane. The barrier layer is a plasma-polymerized layer.

The properties of plasma-polymerized layers differ significantly from those of conventional polymer-based layers. A significant difference is that layers obtained by plasma polymerization do not have regular repeating units but form complex, irregular structures. Therefore, they cannot be described chemically by means of a structural formula. The polymer chains resulting from plasma polymerization are highly branched and also comprise a high degree of cross-linking. This leads to a particularly good impermeability against gases. Plasma-polymerized layers are therefore characterized by a particularly low gas permeability. They form a particularly effective diffusion barrier against harmful gases.

Optoelectronic components of the above-mentioned embodiment are thus characterized by the fact that they comprise a particularly high stability against light and heat under normal conditions—i.e., in the absence of harmful gases—and at the same time show a high stability in the presence of harmful gases. VOCs in particular can be effectively kept away by the plasma-polymerized layer.

Components of this type can therefore also be installed together with components that release harmful gases. They can therefore also be combined with VOC-critical materials without the risk of a VOC-related decrease in brightness. This facilitates further processing and reduces the risk of undesired failures of optoelectronic components. The range of application of the components is thus extended. In contrast, conventional components had to comply with numerous regulations during further processing to avoid contact with materials that release harmful gases. Due to the barrier layer, it is also no longer necessary to dispense with polysiloxane in the encapsulation in the presence of VOC-critical materials.

According to at least one embodiment, the optoelectronic component is a light emitting diode, or LED for short. The component is preferably designed to emit yellow, blue, red, orange, green or white light or UV light.

According to at least one embodiment of the optoelectronic component, it comprises at least one optoelectronic semiconductor chip with a semiconductor layer sequence. The semiconductor layer sequence of the semiconductor chip is preferably based on a III-V compound semiconductor material. The semiconductor material is preferably a nitride compound semiconductor material such as $AlnIn1-n-mGamN$ or also a phosphide compound semiconductor material such as $AlnIn1-n-mGamP$, where $0 \leq n \leq 1$, $0 \leq m \leq 1$ and $n+m \leq 1$ respectively. The semiconductor material can also be $Al_xGa1-xAs$ with $0 \leq x \leq 1$. The semiconductor layer sequence can contain dopants and additional components. For the sake of simplicity, however, only the essential components of the crystal lattice of the semiconductor layer sequence, i.e., Al, As, Ga, In, N or P, are given, even if these may be partially replaced and/or supplemented by small amounts of other substances.

The semiconductor layer sequence includes an active layer with at least one pn junction and/or with one or more quantum well structures. During operation of the semiconductor chip, electromagnetic radiation is generated in the active layer. One wavelength of the radiation is preferably in the ultraviolet, IR and/or visible spectral range, in particular at wavelengths between and including 200 nm and 700 nm, approximately between 420 nm and 680 nm, for example between and including 440 nm and 480 nm.

According to at least one embodiment, the optoelectronic component comprises a substrate, e.g. a lead frame or a ceramic substrate. For example, the semiconductor chip is arranged on the substrate.

According to at least one embodiment, the optoelectronic component comprises electrical contacts that enable a current supply to the semiconductor chip.

According to at least one embodiment, the optoelectronic component comprises bonding wires.

According to at least one embodiment, the optoelectronic component is a component of the "flip-chip type".

According to at least one embodiment, the optoelectronic component comprises at least one converter platelet.

The converter platelet contains at least one phosphor or converter material that converts primary radiation of longer wavelength into secondary radiation of shorter wavelength. For example, blue light is converted into yellow light. For example, unconverted blue and yellow light is superimposed, resulting in an additive mixture of different spectral colors. For example, the component emits white light. The converter platelet can be arranged directly on the semiconductor chip or be spaced apart from the semiconductor chip. It can be enclosed in the encapsulation.

According to at least one embodiment, the gas permeability of the at least one barrier layer is 2.5 $g/m^2/d$ or less, preferably 1 $g/m^2/d$ or less, more preferably 0.1 $g/m^2/d$ or less. For example, the gas permeability is between 0.001 $g/m^2/d$ and 2.5 $g/m^2/d$, preferably between 0.001 $g/m^2/d$ and 1 $g/m^2/d$, more preferably between 0.001 $g/m^2/d$ and 0.1 $g/m^2/d$. The gas permeability can also be between 0.01 $g/m^2/d$ and 2.5 $g/m^2/d$, for example between 0.01 $g/m^2/d$ and 1 $g/m^2/d$. Barrier layers with such low gas permeabilities offer particularly good protection for the component.

According to at least one embodiment, the at least one barrier layer of the optoelectronic component comprises a layer thickness of at least 10 nm, preferably at least 25 nm, more preferably at least 40 nm, in particular at least 50 nm or at least 60 nm. The thicker the barrier layer, the more effective is the barrier effect of the layer. Layer thicknesses of less than 10 nm can result in a low protective effect against harmful gases. In addition, the surface to be coated may comprise microscopic structures or roughnesses which must be sufficiently overmolded. A layer thickness of at least 25 nm is preferred, because holes (e.g. "pinholes") in the layer can be avoided particularly well and a certain surface roughness of the surfaces to be coated can be compensated well. The higher the layer thickness, the easier surface roughnesses can be compensated and closed layers can be achieved.

According to at least one embodiment, the at least one barrier layer of the optoelectronic component comprises a layer thickness of at most 20 µm, for example at most 10 µm or at most 2 µm, preferably at most 500 nm, more preferably at most 200 nm, at most 150 nm or at most 120 nm. The thinner the barrier layer, the less the barrier layer influences the radiation characteristic of the optoelectronic component. Absorption and the consequent loss of brightness hardly occur in the aforementioned range and decrease the more the thickness of the layer decreases. Thinner layers are also more flexible and thus adapt particularly well to the comparatively soft and deformable polysiloxane of the encapsulation. If the polysiloxane of the encapsulation is deformed, thinner barrier layers are sufficiently flexible not to become brittle despite such deformations. The formation of cracks, which could have negative consequences for protection against harmful gases, can thus generally be avoided even under mechanical stress.

According to at least one embodiment, the at least one barrier layer of the optoelectronic component comprises a layer thickness of 10 nm to 20 µm, preferably from 25 nm to 500 nm, more preferably from 50 nm to 200, for example 60 nm to 120 nm. These can be deposited without high production effort, e.g. by plasma polymerization, and offer good protection against harmful gases. The thinner the layer, the faster the deposition can be carried out. Thinner layer thicknesses (e.g. below 500 nm) are, as already mentioned, also advantageous in order to avoid the risk of undesirable mechanical stresses in the barrier layer. At the same time, the thinner layer thickness minimizes absorption so that the brightness and color location of the radiation emitted by the component is not or hardly affected. Particularly good gas impermeability combined with excellent optical and mechanical properties of the barrier layer can therefore be achieved, especially with layer thicknesses between 25 and 500 nm, for example between 50 and 200 nm.

According to at least one embodiment, the encapsulation of the optoelectronic component comprises at least one surface which forms an outer surface of the optoelectronic component, wherein the barrier layer is arranged directly on this surface. Preferably, the barrier layer forms the outermost layer of the optoelectronic component, i.e., a final layer of the component to the outside.

Preferably, the at least one surface of the encapsulation comprises at least one main beam exit surface of the optoelectronic component. A main beam exit surface can in particular be understood as an outer surface of the optoelectronic component which is located in the beam path of the semiconductor chip and through which a larger part of the radiation emitted in total is emitted than through the other outer surfaces of the optoelectronic component. In this case, the barrier layer is thus arranged at least on one surface of the encapsulation, which forms the main beam exit surface. For example, the main beam exit surface is located on the outer surface of the component opposite a substrate of the component.

According to at least one embodiment, the encapsulation comprises further surfaces forming outer surfaces of the optoelectronic component, which are side surfaces of the component and on which the barrier layer is arranged.

According to at least one embodiment, the barrier layer is arranged only on the surface of the encapsulation that forms the main beam exit surface. Such optoelectronic components can be produced with a particularly low effort.

According to at least one embodiment, the barrier layer is arranged on the surface of the encapsulation which forms the main beam exit surface and additionally on the surfaces of the encapsulation which form side surfaces of the optoelectronic component. Preferably, the barrier layer is arranged on all surfaces of the encapsulation which form outer surfaces of the optoelectronic component. In this case a particularly effective protection against harmful gases is achieved.

According to at least one embodiment, the optoelectronic component has a housing which comprises a cavity in which the at least one semiconductor chip is arranged, wherein the encapsulation comprising a polysiloxane surrounds the semiconductor chip together with the housing. In this case, the plasma-polymerized layer can also be arranged on the housing in addition to the encapsulation. The housing can also be free of the plasma-polymerized layer. The materials used for housings are generally much more impermeable to harmful gases than polysiloxanes. It is therefore not necessary to apply a barrier layer to the housing. A partial deposition on the housing is associated with a lower production effort, because in this case, covers or shading of the housing during the deposition of the plasma-polymerized layer can be dispensed with.

According to a preferred embodiment, at least one barrier layer of the optoelectronic component is a plasma-polymerized siloxane layer. Preferably, the plasma-polymerized siloxane layer is arranged directly on the encapsulation, i.e., it comprises a common interface with the encapsulation. The inventors have found that plasma-polymerized siloxane layers are particularly suitable for protection against harmful gases. They bond particularly tightly with encapsulations comprising polysiloxanes. Finally, plasma-polymerized siloxane layers are characterized by a high degree of cross-linking and a particularly low gas permeability. Gas permeabilities of 1 $g/m^2/d$ or less, preferably 0.1 $g/m^2/d$ or less can be achieved, for example gas permeabilities of 0.001 to 1 $g/m^2/d$. Plasma-polymerized siloxane layers are further characterized by a significantly higher aging stability than many conventional plasma-polymerized layers, for example based on hydrocarbons, which predominantly comprise C—C and C—H bonds. In addition, plasma-polymerized siloxane layers, compared to other plasma-polymerized layers, have a similar refractive index as typical silicone-based or polysiloxane-based encapsulation materials with very high transparency to radiation, especially in the visible spectrum. The transparency of plasma-polymerized siloxane layers is usually greater than 90%, often greater than 92% for the visible light spectrum. Plasma-polymerized siloxanes show no or at most very little inherent coloration. Plasma-polymerized siloxane layers can therefore be designed in such a way that they are essentially free of yellowish or even brownish color shades. The lower the hydrocarbon content in the plasma-polymerized siloxane layer, the lower the inherent coloration. Although plasma-polymerized siloxane layers are comparatively dense, they are still mechanically slightly flexible or ductile, so that crack formation is essentially avoided when deposited on a rather soft encapsulating silicone. In contrast to, for example, purely inorganic layers, such as pure $SiO_2$ layers, the coefficient of thermal expansion is also more similar to the encapsulation to be coated, so that the mechanical stresses occurring during temperature jumps are also lower. The properties of plasma-polymerized siloxane layers can be further adjusted by precise process control. The barrier effect, the optical transparency, the adhesion to the encapsulation, as well as the mechanical properties, e.g., the expansion coefficient and the surface energy, can be further refined.

According to at least one embodiment, the barrier layer is a plasma-polymerized siloxane layer which comprises a silicon content in the plasma-polymerized siloxane layer of between 24 and 35 atomic percent, comprises a carbon content in the plasma-polymerized siloxane layer of between 5 and 50 atomic percent and comprises an oxygen content in the plasma plasma-polymerized siloxane layer between 23 and 63 atomic percent.

The atomic percentage values are standardized so that carbon, silicon and oxygen add up to 100 atomic percent. This means that the proportion of hydrogen in the layer is not taken into account, as the hydrogen content of the layer cannot be reliably determined using the usual methods. The layers naturally also contain a certain amount of hydrogen, which is present in particular in the alkyl side chains of the polymerized siloxane. The composition can be determined by conventional methods, especially XPS or EDX according to the usual procedures.

The composition of the plasma-polymerized siloxane layer thus lies precisely in a range between the compositions of pure $SiO_2$ and the composition of the precursor used (e.g., HMDSO).

A further development of the aforementioned embodiment comprises a carbon content in the plasma-polymerized siloxane layer greater or equal to 5 and less than 25 atomic percent, for example, greater or equal to 5 and less than 15 atomic percent. The layer therefore is comparatively low in carbon. In this case, the layer is comparatively hard and shows a particularly high gas impermeability.

According to another development of the above mentioned embodiment, the plasma-polymerized siloxane layer comprises a carbon content in the plasma-polymerized layer greater or equal to 25 and less or equal to 50 atomic percent. In this case, the layer is rich in carbon and therefore more ductile. Layers of this type adapt better to the polysiloxane of the encapsulation.

Carbon-rich layers are relatively low in oxygen. In this case, for example, the oxygen content of the layer can be between 23 and 40 atomic percent. In contrast, layers low in carbon are comparatively rich in oxygen. In this case, the oxygen content of the layer can, for example, be greater than 40 atomic percent and less than or equal to 63 atomic percent. Regardless of this, the silicon content in the layer is comparatively constant and is always in the range between 24 and 35 atomic percent in the plasma-polymerized siloxane layer, preferably between 28 and 34 atomic percent in the plasma-polymerized siloxane layer.

The higher the oxygen content or the more the composition of the layer approaches that of pure $SiO_2$, the harder and more gas-impermeable it becomes. The higher the proportion of carbon (more precisely hydrocarbon) in the plasma-polymerized siloxane layer, the less hard and brittle the layer is.

In this case, the layer is more flexible and can therefore better withstand mechanical stress. If the soft polysiloxane of the encapsulation underneath the layer is deformed, the plasma-polymerized siloxane layer tends less to form cracks the higher the carbon content becomes.

According to at least one embodiment, the optoelectronic component comprises a plasma-polymerized siloxane layer made of a precursor selected from linear, branched or cyclic siloxanes. A precursor is a starting material, i.e., a reactant, for plasma polymerization.

According to at least one embodiment, the optoelectronic component comprises a plasma-polymerized siloxane layer made of a precursor of the following general formula:

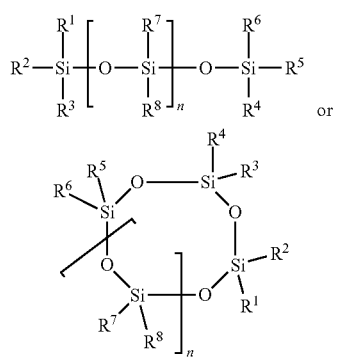

wherein

R$^1$ to R$^8$ are each independently of one another selected from hydrogen, alkyl, alkenyl, and n is selected from 0, 1, 2 and 3.

Alkyl means in particular C1-C5 alkyl, for example, methyl, ethyl and propyl. Preferably, alkyl is methyl. Methyl groups can be easily activated and eliminated during plasma polymerization, which allows good crosslinking and rapid reaction processing.

Alkenyl means in particular C2-C5 alkenyl, for example, vinyl or allyl. Preferably, alkenyl is vinyl. Vinyl groups are functional groups which allow an additional type of cross-linking during plasma polymerization.

n is preferably 0 or 1. Small values for n can have a positive effect on the reaction rate, i.e., accelerate the reaction. If the values for n are too high, the precursors are also difficult to evaporate.

According to at least one embodiment, the plasma-polymerized siloxane layer is produced from several precursors, for example, from two of the precursors mentioned.

According to at least one embodiment, n equals 0, so that the precursor comprises the following general formula:

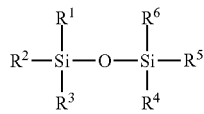

wherein R$^1$ to R$^6$ are each independently of one another selected from hydrogen, methyl and vinyl.

Preferably, at least two of the three radicals R$^1$ to R$^3$ are methyl and at least two of the three radicals R$^4$ to R$^6$ are methyl.

According to at least one embodiment, the precursor is selected from the group comprising

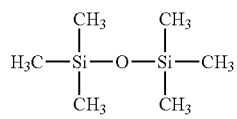

hexamethyldisiloxane (HMDSO),

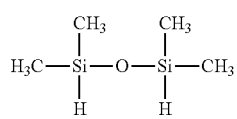

tetramethyldisiloxane (TMDSO),

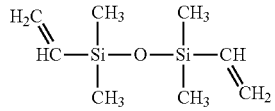

divinyltetramethyldisiloxane (DVTMDSO),

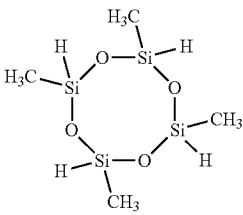

tetramethylcyclotetrasiloxane (TMCTS), and mixtures thereof.

According to at least one embodiment, the plasma-polymerized layer is characterized in that its deposition is carried out in a high-frequency field. The height of the frequency depends on the size and design of the system for depositing the plasma-polymerized layer and can be in the kHz, MHz or GHz range. The frequency can be between 10 kHz and 3 GHz, for example. The frequency is usually system-specific, i.e., it depends on the type of plasma deposition system (typical examples of frequencies of different systems for plasma polymerization are 13.65 MHz, 27.125 MHz, 2.45 GHz (microwave) and 10 or 40-100 kHz). Plasma-polymerized layers deposited in this frequency range show high degrees of cross-linking due to the high energy input and thus low gas impermeability.

According to at least one embodiment, the plasma-polymerized layer is characterized in that it is deposited with an inductively coupled plasma (ICP for short). However, other discharge types such as capacitive coupled or microwave-induced plasmas are also conceivable.

According to at least one embodiment, the plasma-polymerized layer is characterized in that it is deposited at atmospheric pressure or in a vacuum, for example, at a pressure of 101325 Pa, i.e., 1 atm.

According to at least one embodiment, the plasma-polymerized layer is characterized in that it is deposited in a vacuum, e.g., at 0.1 Pa to 1000 Pa. A deposition in a vacuum enables a particularly controlled and uniform deposition. Vacuum deposition can be carried out at low temperatures. During such a process, the optoelectronic component is heated to a temperature of only 60 to 70° C., for example. The heating of the component or the encapsulation on which the deposition is carried out is due to the heat loss of the plasma. Such a process is particularly gentle on the component and ensures a high quality of the plasma-polymerized layer.

According to at least one preferred embodiment, the plasma-polymerized layer is characterized in that it is deposited under atmospheric pressure, i.e., in an atmospheric plasma. Deposition in an atmospheric plasma has the advantage that it allows higher deposition rates than deposition in a vacuum. Furthermore, deposition at atmospheric pressure allows a significantly lower amount of equipment to be used at lower costs than deposition in a vacuum. A vacuum chamber is then not necessary. The inventors have recognized that an excellent barrier effect of the plasma-polymerized layer can also be achieved with deposition in an atmospheric plasma.

According to at least one embodiment, the plasma-polymerized layer is characterized in that it is deposited in the absence of oxygen. For example, the deposition can be carried out in the presence of argon. It is also possible that the deposition is carried out only in the presence of the precursor, without argon or any other gas being present. Deposition in the absence of oxygen results in the resulting plasma-polymerized layer comprising a lower oxygen content and a higher carbon or hydrocarbon content than when deposition is performed in the presence of $O_2$. The lower the oxygen content of the atmosphere in the plasma during the deposition process, the higher the carbon or hydrocarbon content of the resulting plasma-polymerized layer and the lower the oxygen content. This is in particular applicable to plasma-polymerized siloxane layers. Plasma-polymerized siloxane layers deposited in an atmosphere with a low oxygen content have a comparatively high proportion of alkyl side chains which are not eliminated during plasma polymerization. This leads to a good ductility and softness of the plasma-polymerized siloxane.

According to at least one embodiment, the plasma-polymerized layer is characterized in that it is deposited in the presence of an oxidizing gas, in particular an oxygen-containing gas, e.g., oxygen ($O_2$). The higher the proportion of oxygen-containing gas in the atmosphere in which the plasma-polymerized layer is deposited, the higher the oxygen content of the resulting layer. This is in particular applicable to plasma-polymerized siloxane layers. If the deposition of a plasma-polymerized siloxane layer is carried out at high $O_2$ content in the atmosphere, only a small amount of alkyl side chains remain in the plasma polymerized layer. Consequently, the carbon and hydrogen content of the plasma-polymerized siloxane layer is low. The elemental composition of the layer then approaches that of a layer of the composition $SiO_2$, although a certain proportion of carbon and hydrogen can remain in the layer in the range of a few at %. For example, the ratio of precursor to oxygen at which the deposition of the plasma-polymerized layer is carried out can be between 1:1 and 1:2. The ratio refers here and in the following to the volume fluxes of the precursor and oxygen gas flows supplied during the plasma polymerization. The ratios can be further adjusted according to the selected system configuration. In the case of plasma-polymerized siloxane layers, layers with a particularly high gas impermeability can be obtained with such high oxygen contents. These layers are similar in composition to $SiO_2$, but are somewhat more ductile and less brittle than pure $SiO_2$ due to a certain residual carbon and hydrogen content. Such plasma polymerized layers are scratch-resistant and offer excellent protection against VOCs.

According to at least one embodiment, the plasma-polymerized layer is characterized in that the deposition of the plasma-polymerized layer is carried out in the presence of air. In this way, a layer with a high oxygen content can be achieved. At the same time, the deposition can be carried out with little effort and at a particularly low cost. This method is also suitable for industrial scale and can be combined well with deposition in atmospheric plasma at atmospheric pressure.

According to at least one embodiment, the plasma-polymerized layer is characterized in that the ratio of precursor to oxygen during deposition of the plasma-polymerized layer is between 1:0 and 1:2, for example between 1:0 and 1:1. If the ratio is between 1:0 and 1:1, the resulting plasma-polymerized layer is comparatively rich in carbon or low in oxygen and therefore comparatively soft. If the ratio is between 1:1 and 1:2, the resulting plasma-polymerized layer is lower in carbon or higher in oxygen and thus harder. The flexibility or ductility of the layer can therefore be adjusted as desired.

According to at least one embodiment, the deposition of the plasma-polymerized siloxane layer is carried out in the absence of an oxidizing gas. Then the deposition takes place e.g., in the presence of an inert gas such as argon or alternatively only in the presence of the precursor. In this case, a particularly high carbon content is achieved in the plasma-polymerized siloxane layer.

According to at least one embodiment, the plasma-polymerized layer is characterized in that during its deposition one parameter or several parameters are varied so that the plasma-polymerized layer comprises at least one gradient. For example, the ratio between precursor and oxygen, the pressure or the plasma power is changed. Often, however, the plasma power is determined by the system used for plasma polymerization and remains unchanged. For the example of a plasma-polymerized siloxane layer, a higher plasma power usually leads to a higher tendency of the alkyl side chains to be eliminated during the plasma polymerization and the resulting layer is therefore lower in carbon or higher in oxygen. By the appropriate choice of parameters, for example, a gradient in the proportion of oxygen in the plasma-polymerized layer can be obtained. As described above, this is possible mainly by a suitable choice of the ratio between precursor and oxygen during deposition. For example, the plasma polymerization can be started with a low $O_2$ content or completely without $O_2$, for example, in an atmosphere that contains only Ar besides the precursor. After a first part of the barrier layer with a certain thickness, e.g., 20 nm, is deposited in this way, the $O_2$ content can be increased. The ratio between precursor and oxygen during deposition is thus shifted towards a higher oxygen content. This way, a gradient regarding the oxygen content in the plasma-polymerized layer is formed. In this case, the oxygen content increases from the inside to the outside, relative to the optoelectronic component, and in the same way the carbon and thus the hydrocarbon content decreases from the inside to the outside. The layer is then softer on the inside than on the outside. To the outside, the barrier layer thus becomes increasingly harder and more impermeable to gas.

According to at least one embodiment, the optoelectronic component comprises at least one further barrier layer, i.e., a second barrier layer, on top of the first barrier layer. Preferably, the further barrier layer is arranged directly on the first barrier layer, i.e., the two layers comprise a common interface. Preferably, both layers are plasma-polymerized layers, in particular plasma-polymerized siloxane layers. For example, both layers can be deposited in the same way and thus comprise the same properties with regard to their composition and barrier effect. Preferably, however, the two plasma-polymerized layers are deposited by varying at least one parameter during plasma polymerization. More preferably, both barrier layers are plasma-polymerized siloxane layers, wherein the second layer is deposited in the presence of a higher proportion of $O_2$ than the first layer. In this way, a first barrier layer is first obtained on the encapsulation comprising a polysiloxane, which still has a higher carbon content. The first layer already comprises good barrier properties. The second plasma-polymerized siloxane layer, which is deposited in the presence of a higher $O_2$ content than the first layer, is finally characterized by a higher oxygen content in the layer and is harder, more scratch-resistant and particularly impermeable to gas. The first barrier layer is then softer. As described above, the plasma-polymerized layer is then better adapted to the underlying polysiloxane of the encapsulation. If the usually much softer polysiloxane of the encapsulation is deformed, the plasma-polymerized siloxane layer positioned above it is then flexible enough not to break despite deformation within certain tolerance ranges and thus not to form cracks. The second barrier layer is particularly impermeable to gas. The combination of these layers achieves a particularly good overall protective effect against VOCs.

Furthermore, the surface energy or the surface properties of the layer can be adjusted by a gradient or a thin final layer (with a thickness of some tenths of a nm to some nm).

For example, the layer can be made hydrophilic or hydrophobic, depending on whether the ratio of precursor to oxygen is chosen large or small. If the proportion of oxygen is high (e.g., ratio of 1:1 to 1:2) the surface of the layer becomes hydrophilic. If, on the other hand, the oxygen content is low or no oxygen is present during deposition, the layer becomes hydrophobic. In this way, the properties of the layer can be designed as desired.

According to at least one embodiment, the plasma-polymerized layer is characterized in that it is deposited by means of a nozzle. This method is suitable if the deposition is carried out using atmospheric plasma. For example, the nozzle is scanned over the optoelectronic component or over a number of optoelectronic components of the same type. This allows a simple production with uniform deposition of the plasma-polymerized layer.

Embodiments further relate to a method for producing an optoelectronic component. Preferably, the method described here is used to produce the optoelectronic component described here. In particular, all explanations made for the optoelectronic component apply to both the method and the component.

According to at least one embodiment, the method for producing an optoelectronic component comprises the following steps:

A) providing at least one optoelectronic semiconductor chip (1) configured to emit radiation and at least one encapsulation (2) around the semiconductor chip (1), wherein the encapsulation (2) comprises a polysiloxane, B) depositing at least one barrier layer (3) for protection against harmful gases, on the encapsulation (2) by means of plasma polymerization.

It should be noted that all embodiments and specifications for the optoelectronic component which relate to the deposition of the barrier layer, in particular the plasma-polymerized layer, are valid for the method and in particular with regard to process step B).

The method enables the production of components that are not only particularly stable against light aging and heat in the absence of harmful gases, but are also unaffected by harmful gases. The method is also suitable for industrial scale.

According to at least one embodiment of the method, a surface of the encapsulation is pretreated or cleaned prior to step B). In this way, the layer adhesion of the plasma-polymerized layer can be improved.

According to at least one embodiment of the method, a surface of the encapsulation is pretreated with plasma prior to step B). A pretreatment or cleaning by plasma, e.g., by means of Ar-, $O_2$-, $N_2$-, $NH_3$-plasma or mixtures thereof, leads to particularly good adhesion of the plasma-polymerized layer on the encapsulation. Air plasma is in particular suitable for plasma polymerization with atmospheric plasma. Ar-Plasma is in particular suitable if the plasma polymerization is carried out in vacuum.

According to at least one embodiment of the method, plasma pretreatment takes place immediately before coating. The pretreatment can, for example, be carried out in the same system for plasma deposition as the plasma polymerization.

At least one embodiment of the method comprises the further method steps A0) and C), wherein in step A0), which precedes step A), a plurality of semiconductor chips (2) are applied and attached to a substrate (7) and are provided with an encapsulation (3), and wherein in step C) the semiconductor chips with encapsulation are separated, wherein step C) is carried out prior to or after step B).

Separation is understood to be a segregation. Thus, the semiconductor chips with encapsulation, which each result in an optoelectronic component, are separated from one another. Separation can be carried out by sawing, cutoff grinding, cutting or etching, for example. The substrate, for example, can also be cut through. Alternatively, the encapsulation is cut through, but not the substrate. This creates gaps between the individual units, each comprising a semiconductor chip and an encapsulation. Since the substrate can be a stretchable foil, e.g., a saw foil, the distances can be increased by stretching the foil (if the substrate is a stretchable foil, it is also called a temporary substrate). The distances between the components can therefore be adjusted to achieve a coating not only on the surface of the components, but also on the side surfaces.

If the separation is carried out prior to step B), i.e., before the application of the plasma-polymerized layer, this leads not only to components preferably being coated on the main beam exit surface of the component, i.e., the surface of the encapsulation through which the majority of the radiation leaves the component, but also to the side surfaces of the encapsulation being coated uniformly. In this way, all surfaces of the encapsulation, which form the outer surfaces of the optoelectronic component, are coated with the plasma-polymerized layer. This provides effective protection against harmful gases on all sides.

If, on the other hand, separation takes place after step B), only the surface of the encapsulation is coated, which forms the main beam exit surface of the component. This is particularly easy to implement in terms of process engineering and is less expensive. In this case, the side surfaces are not coated with the barrier layer. Because, depending on the geometry of the component, the diffusion paths are longer when harmful gases penetrate from the side surfaces than when they penetrate from the main beam exit surface, with a suitable geometry of the component, a coating of the main beam exit surface is often sufficient to achieve effective protection against harmful gases. In some components, the semiconductor chip is also arranged in a cavity of a housing so that the semiconductor chip is laterally already sufficiently protected by the housing.

According to one embodiment, the separation is carried out by punching.

BRIEF DESCRIPTION OF THE DRAWINGS

Further advantages, advantageous embodiments and further developments result from the exemplary embodiments described below in conjunction with the figures.

In the figures:

FIGS. 3A to 3F show a schematic illustration of the processes inside a conventional optoelectronic component that lead to a loss of brightness and changes in color.

FIG. 6 shows a schematic illustration of an embodiment of an optoelectronic component with two barrier layers.

FIGS. 7A and 7B show schematic illustrations of embodiments of an optoelectronic component with one barrier layer on the main beam exit surface and optionally additionally on the side surfaces of the encapsulation.

FIG. 8 shows an embodiment of a method for producing optoelectronic components, with the plasma-polymerized layer being applied prior to separation of the components.

FIG. 9 shows an embodiment of a method for producing optoelectronic components with a deposition of the plasma-polymerized layer after separation of the components.

DETAILED DESCRIPTION OF ILLUSTRATIVE EMBODIMENTS

In the exemplary embodiments and figures, identical, similar or similarly acting elements can each be provided with the same reference signs. The depicted elements and their proportions among each other are not to be regarded as true to scale. Rather, individual elements such as layers, components, devices and areas can be shown exaggeratedly large for better representation and/or better understanding.

Figure 1A:
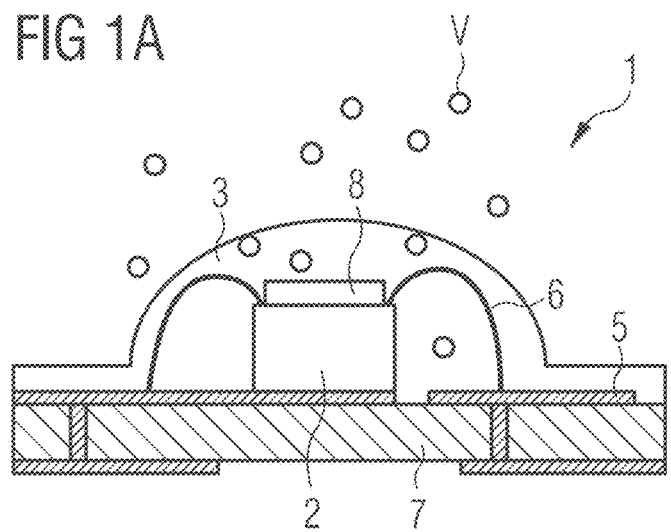
FIGS. 1A and 1B show schematic illustrations of conventional optoelectronic components in the presence of harmful gases.
Figure 1B:
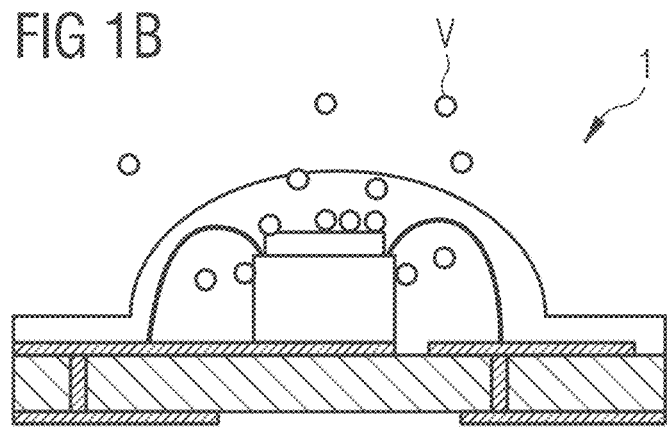

FIGS. 1A and 1B show schematic illustrations of conventional optoelectronic components (1) in the presence of harmful gases (V). The components can comprise a semiconductor chip (2) and an encapsulation (3). The components can also comprise a substrate (7), electrical contacts (5), bonding wires (6) and converter platelets (8). After their production, optoelectronic components are often processed together with materials that themselves release harmful gases (V) such as VOCs. The individual molecules of these harmful gases (V) can diffuse through the encapsulation (3) of conventional components. The inventors have recognized that in particular silicones as encapsulation materials are particularly permeable to many different gases. In this way, the harmful gases can get in the vicinity of the semiconductor chip (2) and decompose there under the influence of heat and light, especially of UV radiation or blue light. The formation of colored decomposition products accelerates further degradation and leads to locally increased temperatures as well as the absorption of blue light. The luminous flux decreases and a CxCy shift towards yellow can be observed. In particular, these processes take place when the optoelectronic component is located in an environment that is closed to the outside, i.e., when there is insufficient gas exchange.

Figure 2:
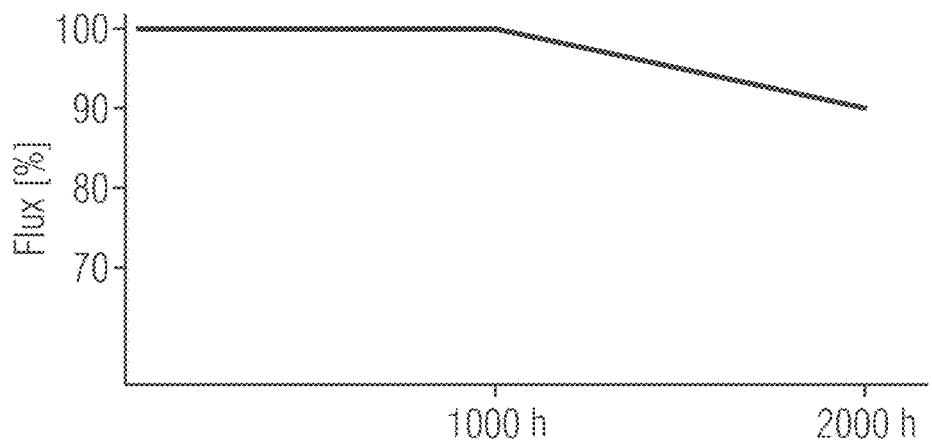
FIG. 2 shows a schematic illustration of the drop in luminous flux of a conventional optoelectronic component with increasing operating time in the presence of harmful gases.

FIG. 2 shows how the luminous flux, given in flux, of conventional optoelectronic components changes over time in the presence of VOCs. The original luminous flux decreases with increasing operating time. This is due to the fact that a conventional polysiloxane-based encapsulation is not capable of permanently blocking the harmful gases. After the harmful gases have penetrated into the vicinity of the semiconductor chip, the above-mentioned decomposition and deposition inside the component occurs, resulting in the depicted decrease in luminous flux.

Figure 3C:
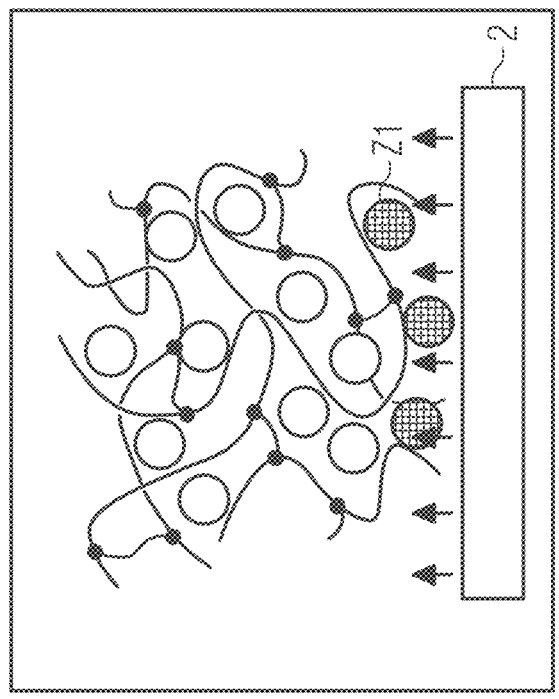
Figure 3D:
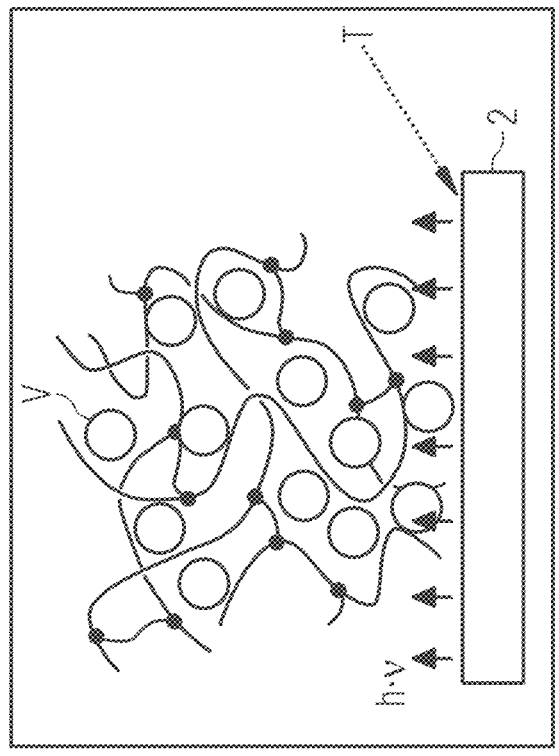
Figure 3E:
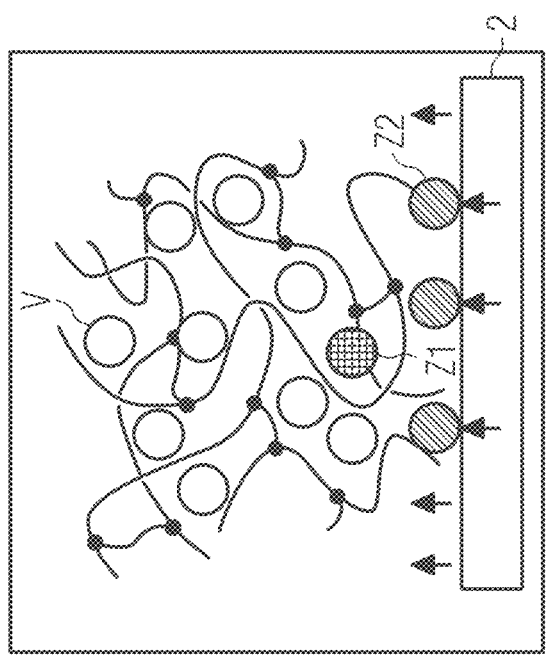
Figure 3F:
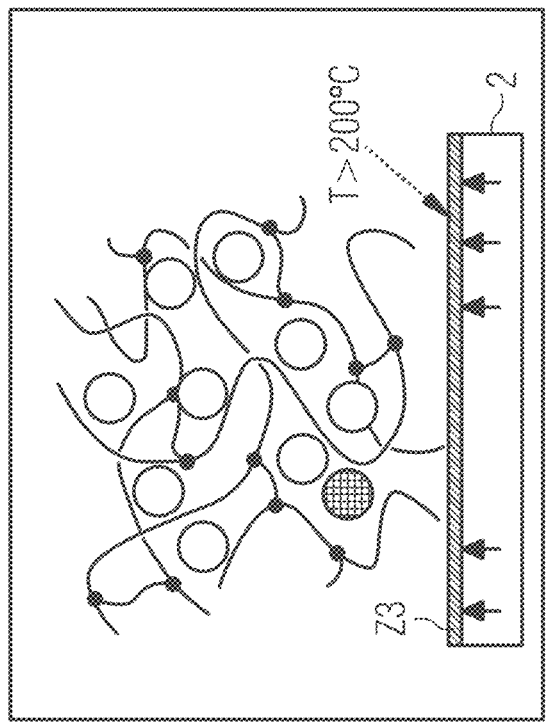

FIGS. 3A to 3F schematically illustrate the processes that take place inside a conventional optoelectronic component in the presence of harmful gases (V). FIG. 3A schematically shows the structure of a silicone, with polymer chains (P) and their cross-linking at nodes (K), as used in encapsulations. Silicones are characterized by loosely linked polymer chains, which have a Si—O backbone. Because of the large free volume in the silicone network, volatile organic compounds in particular can easily penetrate the silicone and diffuse through the silicone. In this way, VOCs can also reach the vicinity of the semiconductor chip, e.g., a semiconductor chip (2) that emits blue light (2) (FIGS. 3C and 3D). Under the influence of such high-energy electromagnetic radiation (h·v) as well as under the influence of locally elevated temperatures (T), organic compounds begin to decompose and change color in the vicinity of the semiconductor chip (2), so that a yellowish color can be observed at first, then a brownish color and finally blackening. The yellowish, brownish decomposition products (Z1) absorb the electromagnetic radiation, such as blue photons, particularly strongly and thus accelerate local heating and thus further decomposition and degradation. The organic compounds decompose further and finally form solid depositions (Z2) on the surface of the semiconductor chip (FIG. 3E). Finally, the entire surface of the semiconductor chip is covered with a brownish, black layer (Z3) of decomposition products or depositions containing predominantly carbon (FIG. 3F). At this stage, the luminous flux drops to zero, as no more photons can penetrate through the layer of depositions (Z3). Due to the high temperatures of this layer (partly T>200° C.), silicones in the vicinity of the layer (Z3) can also decompose.

Figure 4:
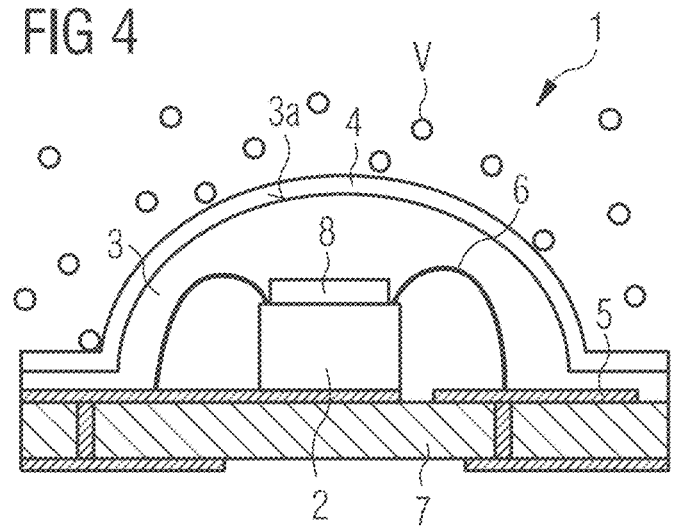
FIG. 4 shows a schematic illustration of an embodiment of an optoelectronic component.

FIG. 4 shows a schematic illustration of a cross-sectional view of an embodiment of an optoelectronic component (1), with semiconductor chip (2) and encapsulation (3) around the semiconductor chip (2). The encapsulation comprises a polysiloxane. The optoelectronic component can further comprise bonding wires (6) which can connect the semiconductor chip (2) to electrical contacts (5). The semiconductor chip (2) can be applied to a substrate or carrier (7) so that the encapsulation (3) together with the substrate (7) surrounds the semiconductor chip (2). The embodiment shown comprises a barrier layer (4) for protection against harmful gases (V), in particular a plasma-polymerized layer (4), which is arranged on the encapsulation (3), preferably arranged on at least one surface of the component which forms an outer surface of the component. For example, the outer surface may be the main beam exit surface (3a) of the device. The barrier layer (4) serves as a barrier to harmful gases (V) and thus slows down or prevents the degradation processes described above.

Figure 5A:
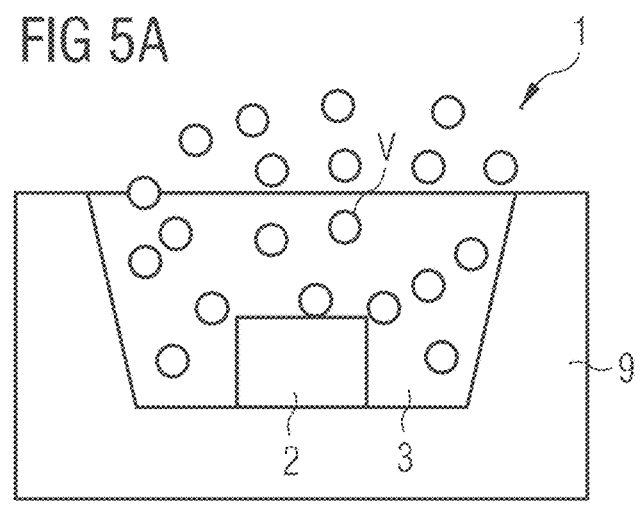
FIGS. 5A and 5B show a schematic illustration of a conventional optoelectronic component and an optoelectronic component according to embodiments in the presence of harmful gases.
Figure 5B:
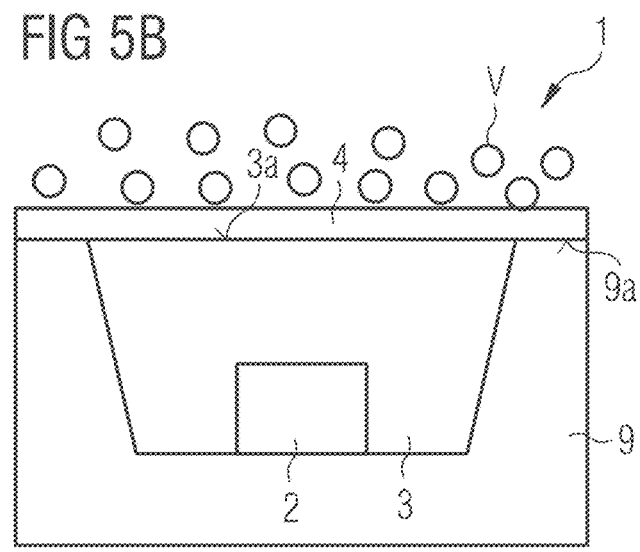

FIGS. 5A and 5B show a schematic illustration of cross-sectional views of a conventional component (FIG. 5A) without a barrier layer and an optoelectronic component (FIG. 5B) with a barrier layer (4), both in the presence of harmful gases (V). The barrier layer is a plasma-polymerized layer, in particular a plasma-polymerized siloxane layer, which can be made of precursors such as HMDSO, TMDSO or DVTMDSO. The deposition is carried out in a plasma or PECVD process, preferably as a low-pressure process. Whereas in the conventional component (1), harmful gases (V) permeate the encapsulation comprising polysiloxane (3), the barrier layer (4) of the embodiment shown in FIG. 5B slows down or prevents harmful gases (V) from permeating into the interior of the component (1). The component may have a housing (9). Most common housing materials are less gas permeable than encapsulations comprising silicones. Therefore, the housing does not need to be coated with the barrier layer. The outer surface of the housing can therefore be at least partially free of the barrier layer. However, parts of the housing (9a) can also be covered with the barrier layer (4). In particular, the outer surface of the component (9a), which is a surface of the housing (9) and is adjacent to the main beam exit surface (3a) of the component (3a), can be completely or partially coated with the barrier layer (4). It is therefore not necessary to shade or cover the housing during the deposition process of the barrier layer.

FIG. 6 shows a schematic illustration of a cross-sectional view of an embodiment of an optoelectronic component (1) with two barrier layers (4), (40). Two or even more barrier layers improve the protective effect against VOCs. The layers can be the same or different. Preferably, the two barrier layers differ in their composition. Further preferably, the first barrier layer (4) has a higher carbon content than the second barrier layer (40). Preferably, the second barrier layer (40) has a composition with a higher oxygen content than the first barrier layer (4). Thus, the first barrier layer (4) is softer and more ductile and bonds particularly well with the polysiloxane of the encapsulation (3) and the second barrier layer (40) is particularly hard and impermeable to gas. This applies in each case not only to optoelectronic components with a housing (9) as shown in FIG. 6, but also to all other embodiments.

FIGS. 7A and 7B show schematic illustrations of embodiments of an optoelectronic component (1). In FIG. 7A, the barrier layer (4a) is arranged on a surface of the encapsulation (3), which at the same time forms an outer surface of the component (1) and represents a main beam exit surface (3a) of the component (1). The side surfaces (3b), on the other hand, are free of the barrier layer (4). FIG. 7B shows an embodiment in which the barrier layer (4a, 4b) is also arranged on the side surfaces (3b) of the encapsulation (3). The component also has a semiconductor chip (2). The component shown in FIGS. 7A and 7B also comprises bonding wires (6) and electrical contacts (5). In FIGS. 7A and 7B, the layer beneath the contact (5) is a temporary substrate. This originates from the production process (see temporary substrate (7) in FIGS. 8 and 9). The finished component (1) no longer contains the temporary substrate, so that the electrical contacts (5), which are, for example, metal contacts, form the underside of the component.

FIG. 8 shows an embodiment of a method for producing optoelectronic components (1), with an application of the plasma-polymerized layer (4) before separation of the components (1). First of all, semiconductor chips (2) and an encapsulation (3) are provided. For this purpose, the semiconductor chips (2) are preferably arranged on a temporary substrate (7) and attached to it. The encapsulation (3) can, for example, be flat encapsulated or flat molded silicone. In the embodiment of the method shown in FIG. 8, at least one barrier layer (4) is deposited in the substrate composite. This means that the deposition of the barrier layer (4) is carried out before the separation of the components (1). During such a method, components (1) are obtained which are coated only on their upper surface, i.e., on the outer surface of the encapsulation which forms a main beam exit surface (3a) of the component. In contrast, the side surfaces (3b) are free of the barrier layer (4). In this way, a component (1) is obtained as shown in FIG. 7A. Such components can be produced with less effort in terms of process technology. The temporary substrate (7) can be removed at the end.

FIG. 9 shows a different embodiment of a method for producing optoelectronic components (1), with the application of the plasma-polymerized layer (4) after the separation of the components. The method differs from the process shown in FIG. 8 thus only in that the components (1) are first separated and that only after that the barrier layer (4) is deposited. In this way, both the main beam exit surface (3a) and the side surfaces (3b) are coated. An optoelectronic component as shown in FIG. 7B is obtained. Such components offer protection from harmful gases on all sides and are therefore particularly stable. Here too, the temporary substrate can be removed at the end of the production process.

Figure 10:
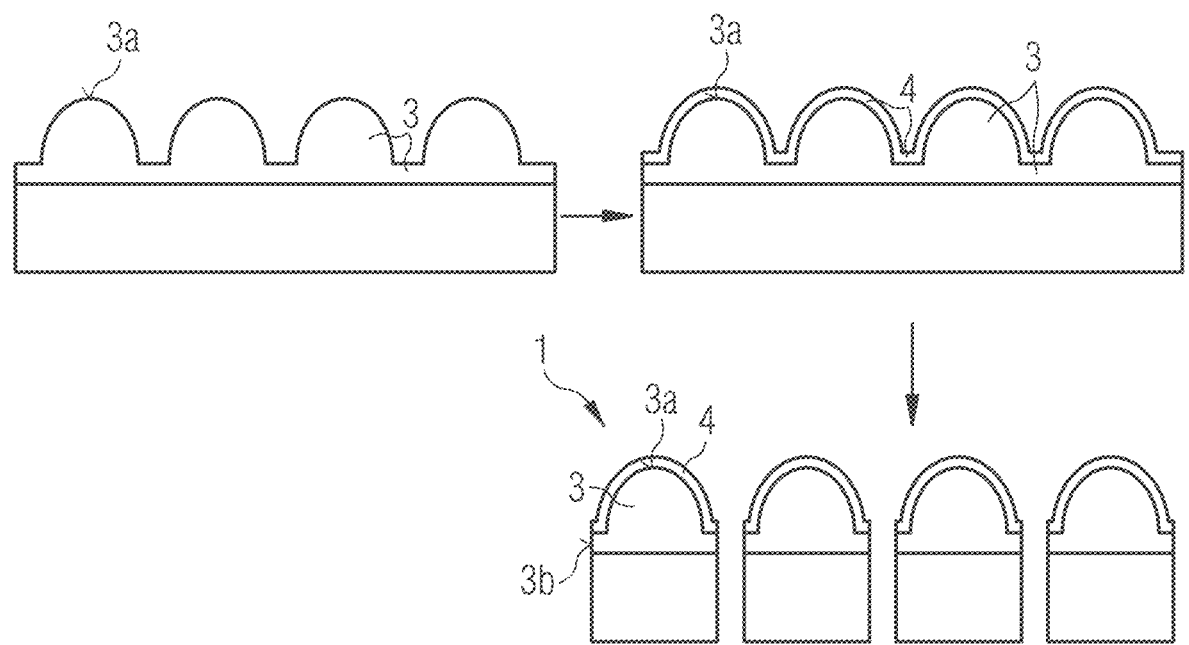
FIG. 10 shows an embodiment of a method for producing optoelectronic components with a deposition of the plasma-polymerized layer prior to separation of the components, wherein the components comprise an encapsulation in lens form.

FIG. 10 shows an embodiment of a method for producing optoelectronic components, with an application of the plasma-polymerized layer (4) prior to separation of the components (1), wherein the components comprise an encapsulation in lens form (3). This can, for example, be an injection-molded silicone lens. These components have side surfaces (3b) which, compared with the main beam exit surface (3a), make up only a small proportion of the total surface area of the encapsulation (3). Especially for components with an encapsulation in lens form (3), a coating of the side surfaces (3b) is usually not necessary to achieve a sufficient protective effect against harmful gases due to the long diffusion paths from the side of the component to the semiconductor chip (2) and the comparatively small uncoated or unprotected encapsulation surface. However, separation prior to coating is also possible.

Figure 11:
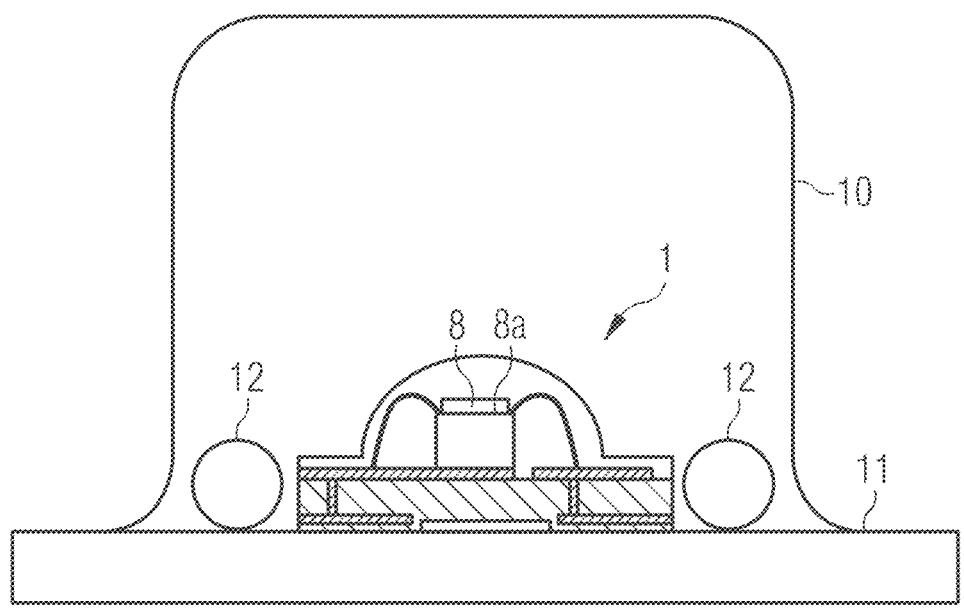
FIG. 11 shows an experimental setup for determining the stability of optoelectronic components in the presence of harmful gases.

FIG. 11 shows an experimental setup for determining the stability of optoelectronic components in the presence of harmful gases. A series of experiments were carried out in which conventional components were tested first. For this purpose, the component to be tested was surrounded with a defined amount of polyurethane adhesive (12). Polyurethane adhesives release considerable amounts of VOCs. Several experiments were carried out with different amounts of adhesive, namely with 3 g to 6 g. The component was finally electrically contacted and then covered with a glass (10) so that the component could be operated in a closed system that did not allow gas exchange with the environment. The glass thus contained VOCs that are released by the polyurethane adhesive. Tests were carried out with beakers of different volumes (beakers with diameter×height=1.5 cm×1.35 cm; 1.0 cm×2.55 cm; 2.2 cm×4.5 cm). The optoelectronic components were operated with currents of 0.1 A, 1 A and 1.2 A. Each test lasted 500 h, but effects can be observed after only a few hours (usually significantly less than 24 h).

Figure 12A:
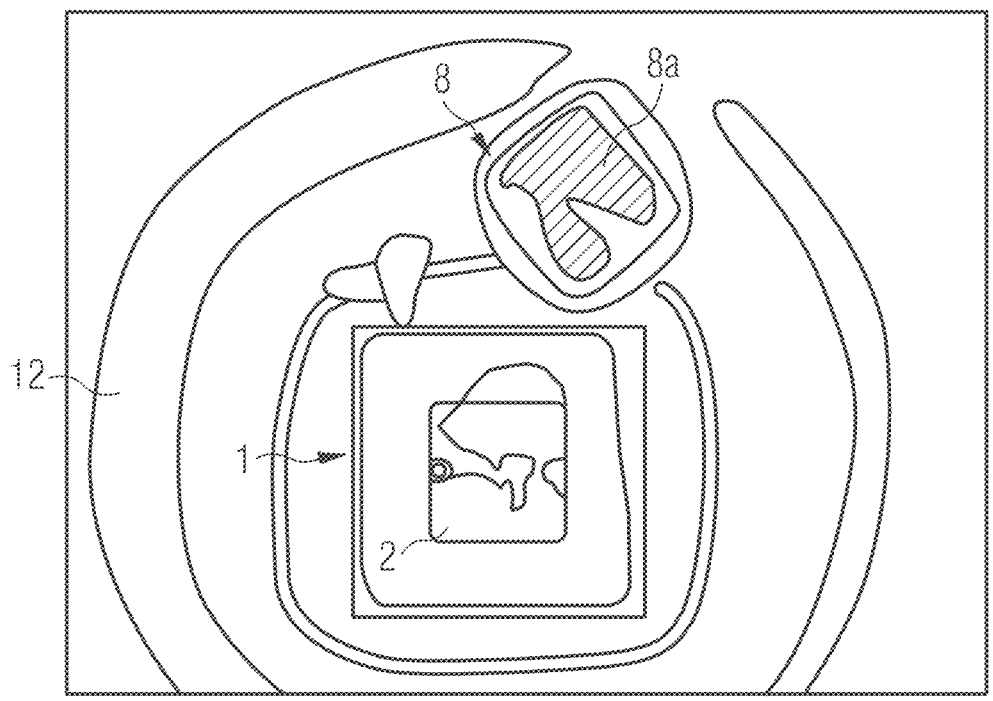
FIGS. 12A and 12B show schematic illustrations of optoelectronic components after a stability test with and without depositions of decomposition products of harmful gases.
Figure 12B:
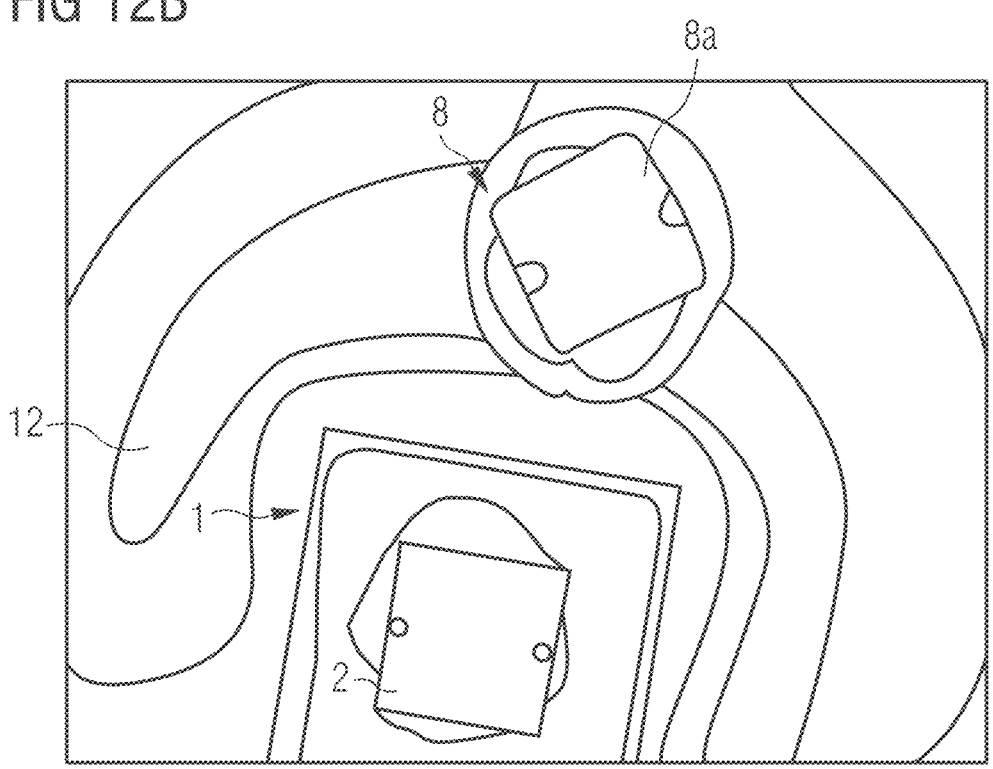
Figure 12C:
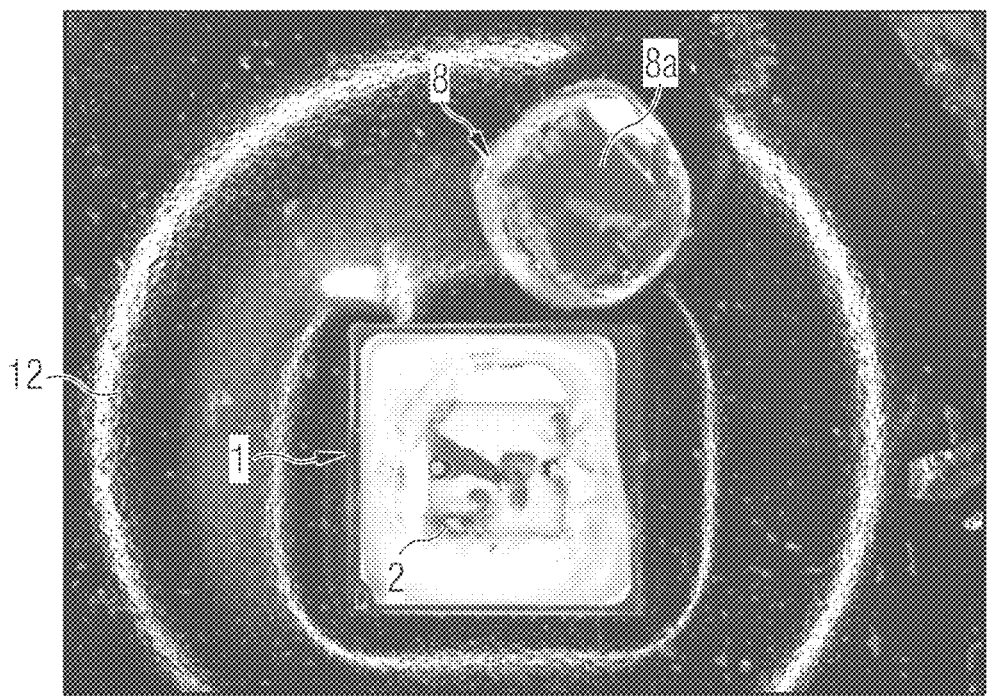
FIGS. 12C and 12D show photographs of optoelectronic components after a stability test with and without depositions of decomposition products of harmful gases.

FIG. 12A shows the schematic illustration and FIG. 12C the associated photograph of a conventional optoelectronic component (1) after one of the tests just described. In this case, LEDs were tested. The photograph still shows the adhesive (12) that was applied around the component (1) for the test. After the test, the component was separated and thus destroyed in order to make the depositions inside the component visible. The photograph shows the lower part of the destroyed component (1) with the semiconductor chip (2). Further, the photograph shows the upper part with lens and converter platelet (8). The upper part was turned upside down after separation so that the underside of the converter platelet (8a) is visible. As can be seen in FIG. 12A and the photograph of FIG. 12C, a conventional component shows a very high level of depositions on the underside of the converter platelet (8a) after the test. The depositions have therefore been deposited near the semiconductor chip, namely at the interface between the semiconductor chip and the converter platelet. During operation of the component tested, a sharp drop in luminous flux was also observed.

Figure 12D:
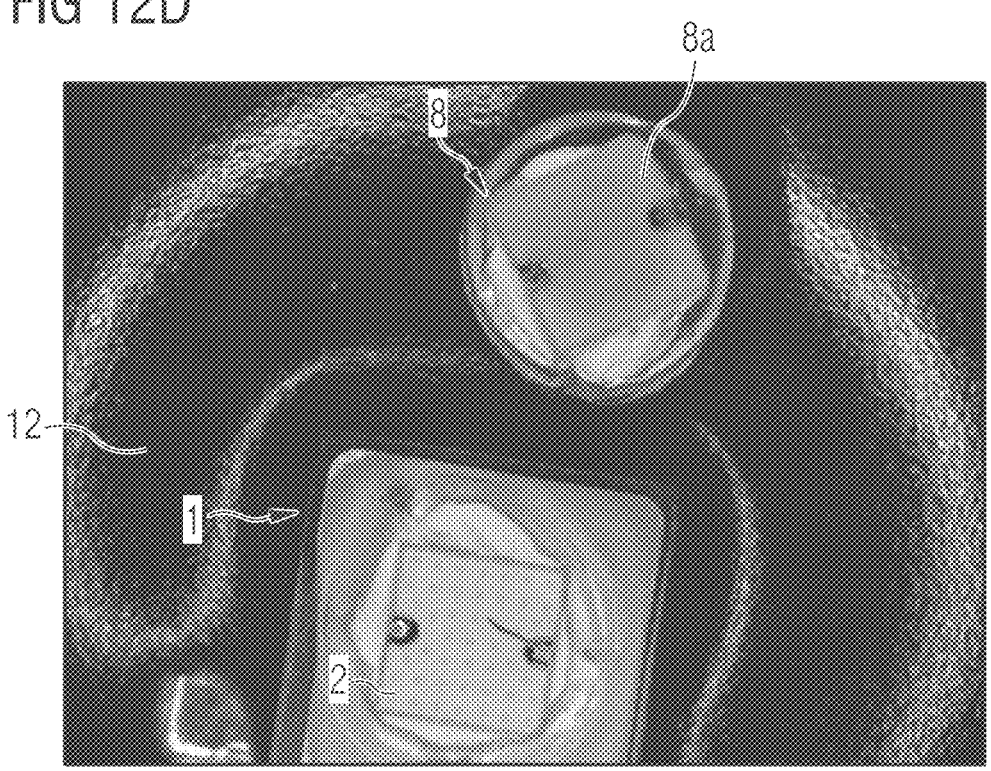

In contrast, FIG. 12B and photograph 12D show a conventional optoelectronic component, in which the same test was first performed using the same conditions as in the example just mentioned (i.e., exposure to VOCs from a polyurethane adhesive in a beaker, i.e., in a closed system). Afterwards the beaker was removed and the component was operated further. In this case, it can be observed that in open systems, with sufficient ventilation, the carbon depositions are slowly removed again. With sufficiently long operation in an open system, the brightness can be largely restored. In the present case, the test was continued for several hundred hours, so that a brightness of 95% of the original value could be restored. However, since many optoelectronic components are permanently installed in closed systems together with, for example, polyurethane adhesives or other VOC-emitting components, there is no recovery of brightness in such cases. The inventors have recognized this problem and solved it by the disclosed embodiments of the component. Experiments on components with a barrier layer, in particular a plasma-polymerized siloxane layer, do not lead to a significant deposition of carbons from the beginning after performing the aforementioned test, an exposure to VOCs in a closed system (without subsequent operation in an open system), and there is hardly any loss of brightness. Consequently, when a component is separated, the same picture as shown in FIGS. 12B and 12D appears, namely no significant carbon depositions and hardly any loss of luminous flux. The barrier layer thus offers effective protection against harmful gases, so that luminous flux, brightness and color of the component remain largely unchanged even when operated in the presence of harmful gases. The barrier layer thus enables components that are particularly stable even in the presence of harmful gases.

The exemplary embodiments and their features described in conjunction with the figures can also be combined with each other according to further exemplary embodiments, even if such combinations are not explicitly described or shown in the figures. Furthermore, the exemplary embodiments described in conjunction with the figures may have additional or alternative features according to the description in the general part.

The invention is not limited to the exemplary embodiments by the description based on the exemplary embodiments. Rather, the invention comprises any new feature as well as any combination of features, which in particular includes any combination of features in the claims, even if this feature or combination itself is not explicitly stated in the claims or exemplary embodiments.

The invention claimed is:
1. An optoelectronic component comprising:
an optoelectronic semiconductor chip configured to emit radiation;
an encapsulation around the semiconductor chip, wherein the encapsulation comprises a polysiloxane; and
a barrier layer for protection against harmful gases, the barrier layer being arranged on the encapsulation,
wherein the barrier layer is a plasma-polymerized siloxane layer which is made of at least one precursor of the general formulae:

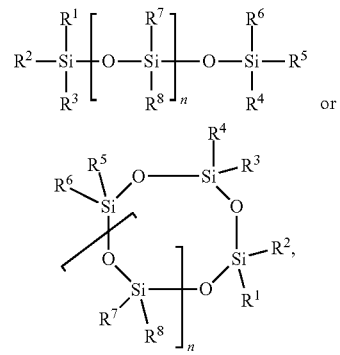

or wherein $R^1$ to $R^8$ are each, independently of one another, selected from hydrogen, alkyl and alkenyl, and
wherein n is selected from 0, 1, 2 and 3.

2. The optoelectronic component according to claim 1, wherein the barrier layer comprises a layer thickness of 10 nm to 20 μm.

3. The optoelectronic component according to claim 1, wherein the encapsulation comprises a surface forming an outer surface of the optoelectronic component, and wherein the barrier layer is arranged directly on the surface.

4. The optoelectronic component according to claim 3, wherein the surface comprises a main beam exit surface of the optoelectronic component.

5. The optoelectronic component according to claim 1, wherein the barrier layer is made of the precursor of the general formula:

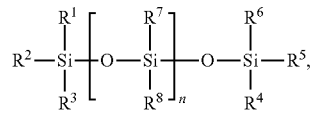

wherein n equals 0 so that the precursor has the following formula:

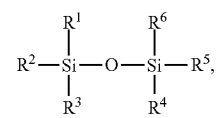

and
wherein $R^1$ to $R^6$ are each, independently of one another, selected from hydrogen, methyl and vinyl.

6. The optoelectronic component according to claim 1, wherein the precursor is selected from the group consisting of

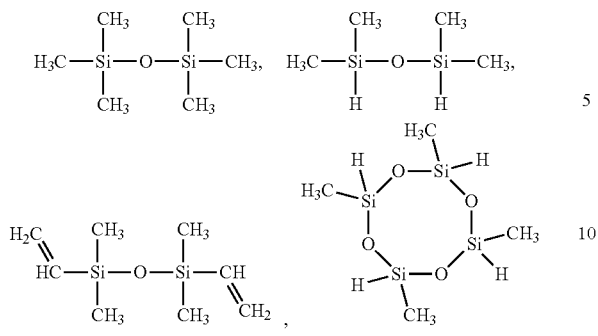

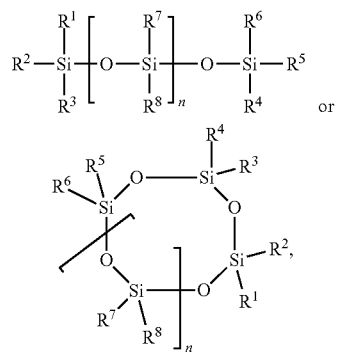

and mixtures thereof.

7. The optoelectronic component according to claim 1, wherein the barrier layer is deposited at atmospheric pressure or in a vacuum.

8. The optoelectronic component according to claim 1, wherein a deposition of the barrier layer is carried out in presence of an oxidizing gas and/or in presence of an inert gas.

9. The optoelectronic component according to claim 1, wherein a deposition of the barrier layer is carried out in presence of air.

10. The optoelectronic component according to claim 1, wherein the barrier layer is deposited in a manner in which one or more deposition parameters are varied so that the barrier layer comprises a gradient.

11. The optoelectronic component according to claim 1, further comprising a further barrier layer on the barrier layer, wherein the further barrier layer is also a plasma-polymerized layer.

12. A method for producing an optoelectronic component, the method comprising:
   providing an optoelectronic semiconductor chip configured to emit radiation and an encapsulation around the semiconductor chip, wherein the encapsulation comprises a polysiloxane; and
   depositing a barrier layer for protection against harmful gases on the encapsulation by plasma polymerization, wherein the barrier layer is a plasma-polymerized siloxane layer made of a precursor of the following general formulae:

wherein $R^1$ to $R^8$ are each, independently of one another, selected from hydrogen, alkyl and alkenyl, and wherein n is selected from 0, 1, 2 and 3.

13. The method according to claim 12, further comprising performing a pretreatment or cleaning of a surface of the encapsulation prior to depositing the barrier layer.

14. The method according to claim 13, wherein performing the pretreatment or cleaning comprises a plasma pretreatment or cleaning.

15. The method according to claim 12, wherein, prior to providing the optoelectronic semiconductor chip and the encapsulation around the semiconductor chip, a plurality of semiconductor chips is applied and attached to a substrate and provided with the encapsulation.

16. The method according to claim 15, further comprising separating the semiconductor chips with the encapsulation prior to or after depositing the barrier layer.

17. The method according to claim 12, wherein depositing the barrier layer comprises depositing the barrier layer by varying one or more deposition parameters so that the barrier layer comprises gradient.

18. The method according to claim 12, wherein further barrier layer is deposited on the barrier layer, wherein the further barrier layer is also a plasma-polymerized layer.

* * * * *